United States Patent [19]

Schenberg

[11] Patent Number: 4,926,140
[45] Date of Patent: May 15, 1990

[54] HIGH GAIN ZERO OFFSET LINEAR PHASE DETECTOR APPARATUS

[75] Inventor: Alan N. Schenberg, Kinnelon, N.J.
[73] Assignee: ITT Corporation, New York, N.Y.
[21] Appl. No.: 382,167
[22] Filed: Jul. 19, 1989
[51] Int. Cl.$^5$ .............................................. H03L 7/18
[52] U.S. Cl. .................... 331/1 A; 331/17; 328/134; 328/155; 307/516
[58] Field of Search .......................... 331/1 A, 17, 25; 328/133, 134, 155; 307/511, 516, 526

[56] References Cited

U.S. PATENT DOCUMENTS 4,668,922 5/1987 Crawford et al. .............. 328/155 X

Primary Examiner—Eugene R. LaRoche
Assistant Examiner—Robert J. Pascal
Attorney, Agent, or Firm—Thomas N. Twomey; Mary C. Werner

[57] ABSTRACT

A phase detector for a phase locked loop (PLL) to be employed in a wideband synthesizer generates a ramp waveform at an output. The ramp waveform has a positive slope during the reference signal; when a sample pulse is received by the circuitry, the slope of the ramp is changed to a negative slope. Hence, the output of the detector will be negative or positive depending upon the difference in phase between the reference and sample frequencies. The ramp voltage is sampled and held by a suitable circuit which provides an error signal for controlling a VCO.

21 Claims, 4 Drawing Sheets

FIG. 3B REF PULSE

FIG. 3C SAMPLE PULSE

FIG. 5B REF. PULSE

FIG. 5C SAMPLE CLOCK

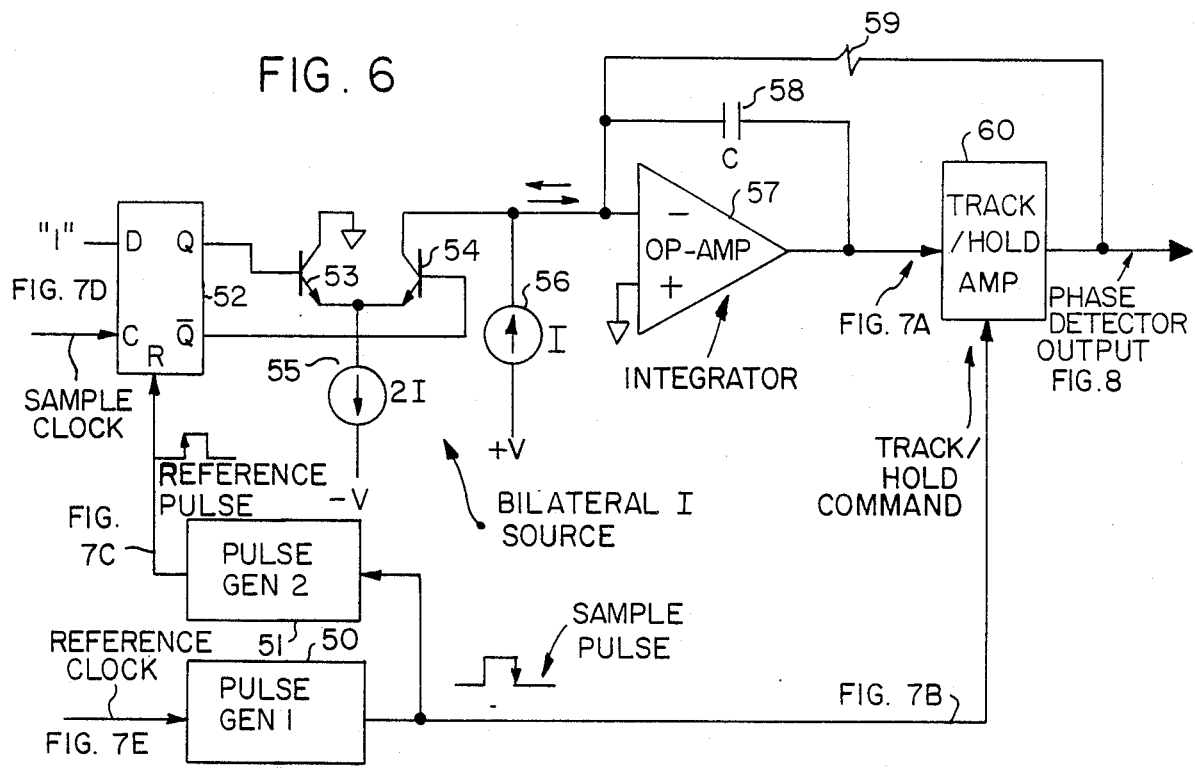
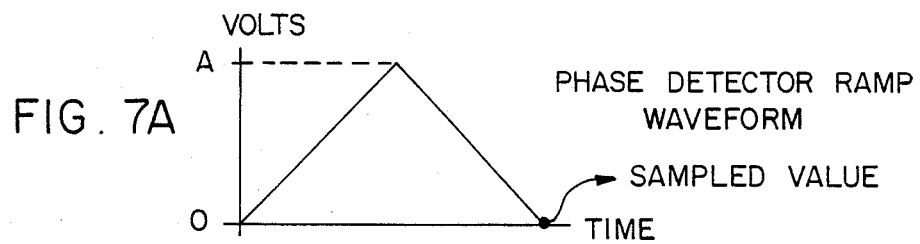

4,926,140

HIGH GAIN ZERO OFFSET LINEAR PHASE DETECTOR APPARATUS

BACKGROUND OF THE INVENTION

This invention relates in general to phase detector apparatus and more particularly to a high gain zero offset linear phase detector for use in frequency synthesizers.

A frequency synthesizer is a device which produces a plurality of synthesized output frequencies where each output frequency is locked to or derived from a stable master frequency source such as a crystal oscillator, an atomic clock and so on. The synthesizer finds many uses in automatic test and communications equipment as for example as a local oscillator for radio receivers and in general as a precision tunable source. The frequency synthesizer has received widespread use and most modern day frequency synthesizers utilize phase locked loops (PLL) as an element in the synthesizer. The PLL includes a phase detector, a low pass filter and a voltage controlled oscillator (VCO). The phase detector is a linear device and its operating characteristics determine the overall loop performance of the phase locked loop.

The term PLL refers to a feedback loop in which the input feedback parameters of interest are the relative phases of the waveforms. The function of a phase detector is to track small differences in phase between the input and feedback signals and to measure the phase difference between two inputs. The output of the phase detector is then filtered by means of a lowpass filter and applied to the control terminal of a voltage controlled oscillator (VCO). The VCO provides an output frequency which is a function of the control signal applied to its control terminal. In the PLL the VCO frequency changes in the direction that reduces the phase difference between the VCO and the reference signal. Such a loop is said to be in phase lock or locked when the phase difference is reduced to zero.

Since the frequency synthesizer is utilized as indicated above in communication and test systems, the output available from the frequency synthesizer must be accurately specified and controlled. One is concerned with frequency range, frequency resolution, frequency indication, frequency error, settling time, output power, harmonic distortion, phase noise, spurious interference, wideband noise and so on. Many of these factors are also associated with the phase locked loop. In particular the phase detector which exists in the phase locked loop is an important component of the loop and under many circumstances can contribute to the purity of the synthesizer output as well as substantially contributing to noise generated by the synthesizer.

Essentially, linear sampling phase detectors are employed in high performance frequency synthesizers to provide improved noise and spurious output performance. These exhibit superior operation than that achievable in synthesizers using digital phase/frequency discriminators.

In a phase detector the primary objects are enable a high speed switching operation and provide improved synthesizer outputs with reduced output spurious frequencies, reduced reference sidebands and lower levels of output phase noise.

It is an object of the present invention to provide an improved sampling phase which sampling phase detector provides lower noise and sideband levels than those in the prior art.

It is another object to provide a linear sampling phase detector with zero offset and which phase detector provides increased gain over prior art phase detectors.

SUMMARY OF THE INVENTION

A phase detector apparatus for providing an output error signal indicative of the phase difference between a stable reference frequency and a variable sample frequency with said error signal used to control the frequency of a voltage controlled oscillator (VCO) to enable the oscillator to lock to the reference frequency, comprising a ramp generator means operative to provide at an output a ramp voltage waveform having a positive slope portion and a negative slope portion for a phase difference between said sample and reference frequency, where the duration of said positive or negative slope portion differs according to said phase difference, a sample and hold circuit means having an input coupled to said output of said generator means for storing a voltage indicative of the amplitude and slope of said ramp waveform during a specified period and for providing an output voltage indicative of said stored voltage to be employed as said error signal.

BRIEF DESCRIPTION OF THE FIGURES

FIGS. 3A, 3B and 3C comprise a series of waveforms describing the operation of the circuit of FIG. 2.

FIGS. 5A, 5B and 5C comprise a series of waveforms depicting the operation of the detector of FIG. 4.

FIG. 6 is a more detailed partial block and circuit diagram of the improved phase detector according to this invention.

FIGS. 7A, 7B, 7C, 7D and 7E comprise a series of waveforms depicting the operation of the phase detector of FIG. 6.

DETAILED DESCRIPTION OF THE FIGURES

Figure 1:
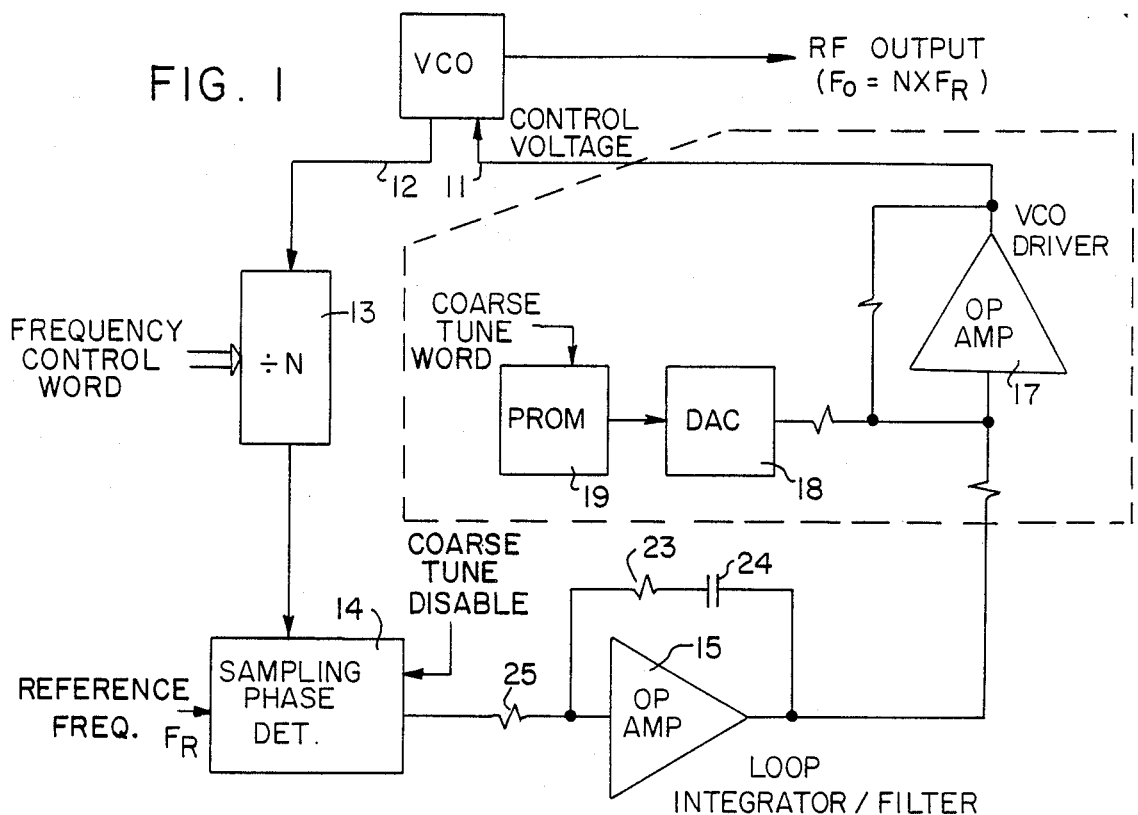
FIG. 1 is a simple block diagram showing a frequency synthesizer employing a phase locked loop having a sampling phase detector.

Referring to FIG. 1, there is shown a simplified block diagram of a PLL frequency synthesizer utilizing a sampling phase detector as employed in the prior art.

As seen in FIG. 1, there is a voltage controlled oscillator or VCO 10. There are many examples of voltage controlled oscillators in the prior art which are utilized in conjunction with frequency synthesizers or otherwise. Such oscillators for example may be controlled using switchable capacitors or variable reactance devices controlled in terms of an input control voltage. Devices which exhibit a change in reactance as a function of an applied control voltage are well known and such devices have been utilized in conjunction with oscillator circuits to change or vary the output frequency. The VCO 10 conventionally supplies an output which is the RF output and which output is locked to a reference frequency. The reference frequency designated as $F_R$ is applied to one input of a sampling phase detector 14. Phase detector 14 of the sampling types are well known and the prior art is replete with many examples of such phase detectors. See a text entitled "Frequency Synthesis By Phase Lock" by William F. Egan, John Wiley & Sons, N.Y. - 1981.

The phase detector 14 depending on operation is a source which can cause noise and spurious output frequencies and thus adversely affect the performance of the synthesizer. Furthermore, if one can achieve higher gain operation in the phase detector, one can reduce the gain of the other components in the phase locked loop. This will further assure lower noise output from the loop in general and hence the synthesizer. It has been determined that with an improvement in phase detector operating gain one can achieve greater attenuation of the reference sidebands without the addition of post-integrator filtering and one can therefore achieve an improvement in sideband suppression utilizing a phase detector which provides zero offset and high gain. The phase detector provides a fast response time to enable the same to be utilized in a wideband high speed frequency synthesizer.

Thus as seen in the figure, the sampling phase detector 14 receives a reference frequency $F_R$ at one input. At the other input the sampling phase detector receives a sample of the VCO signal. The output of the phase detector is an error voltage which varies in accordance with the difference in phase between the signal applied to the inputs thereof.

Thus, as understood, the phase detector 14 receives the input designated as the reference frequency $F_R$ which is supplied by means of a stable or master oscillator circuit such as a crystal oscillator, atomic clock or other stable source. The output from the VCO as taken on lead 12 is applied to the input of a programmable frequency divider 13. Programmable frequency dividers which will divide by a selectable digit N are well known and such devices for example include synchronous and resettable counting devices and can be implemented in CMOS, ECL or by other technologies. Such programmable dividers are available from many sources as conventional integrated circuits as indicated are well known.

Thus, as can be seen, the sampling phase detector 14 receives a reference frequency at one input and the divided VCO frequency at the other input. The phase detector produces an error signal at the output which is proportional to the difference in phase between the oscillator output signal and the reference frequency signal. This error signal is applied to the input of an operational amplifier 15 which is arranged to provide integration and filtering of the error signal. Such operational amplifier circuits 15 used in conjunction with PLL loops are also well known. The operational amplifier 15 contains a series resistance capacitance (RC) network connected between the input and output consisting of resistor 23 and capacitor 24. Resistor 25 couples the input of the amplifier 15 to the output of the phase detector 14. The amplifier 15 is referred to as loop integrator/filter due to the inclusion of resistor 23 in the feedback loop.

The output of the operational amplifier is applied to the input of a VCO driver amplifier 17 whose output is coupled to the control voltage terminal 11 of the VCO 10. Also coupled to the input of the operational amplifier 12 is a digital to analog converter circuit 18 having coupled to its input a programmable read only memory or PROM 19. The PROM 19 is a conventional component as is the digital to analog converter. As seen in FIG. 1, the PROM receives as an input a coarse tune word to enable coarse tuning of the VCO. PROM 19 has stored in the storage locations digital words each of a given bit length. The digital words when converted to an analog voltage will tune the VCO via the amplifier 17 to a course frequency according to the stored digital word as selected. The PROM 19 is addressed by the coarse tune word which is applied by conventional means. The function of the coarse tune word is to provide a voltage to the VCO to assure that the VCO is within the acquisition range of the PLL.

As can be seen from FIG. 1, the conventional coarse tuning system is shown as enclosed within the dashed line configuration and consists essentially of the PROM 19, the digital analog converter 18 and the operational amplifier 17. These devices are conventional prior art and the system works as follows. Initially, the VCO 10 is prepositioned within a loop acquisition frequency range during the coarse tune word, which is a control word to the input address terminal of the PROM 19. The PROM 19 has stored at the appropriate address therein, a digital value indicative of the voltage which when applied to the VCO 10 via the control terminal 11 will cause the VCO to produce an output within the acquisition range of the phase locked loop. The acquisition range of the PLL is the range in which the VCO will be locked to the reference frequency to assure a proper output.

It is important that the VCO be controlled in frequency to approach the desired output frequency within a value enabling one to lock the VCO to the desired output frequency. Thus, the digital output from the PROM 19 is applied to the input of the digital to analog convertor 18 (DAC). The digital to analog converter 18 converts the digital word signal into an analog signal. The analog signal is amplified via the high gain operational amplifier 17 which is the VCO driving summing amplifier. The amplifier 17 produces the control voltage and causes the VCO to be properly tuned. Once coarse tuning is completed, the conventional coarse tuning system maintains a continuous stimulus at the input to the VCO driver amplifier 17 in order to keep the VCO tuned to the proper frequency.

It is also noted that the phase detector 14 is inhibited from operation during coarse tuning. This is a conventional approach to assure that the phase detector does not control the VCO during the coarse tune mode. As indicated, the operation of the sampling phase detector is extremely important to provide consistent loop operation to enable the fast response while further providing a zero offset. Providing a zero offset eliminates the need for compensating for a non-zero offset. A non-zero offset has to be compensated for in the amplifier circuits following the phase detector. Furthermore, the phase detector to be described exhibits gain as compared to prior art phase detectors which therefore allows one to reduce the gain of the additional components in the loop to thereby achieve an improved noise performance.

Figure 2:
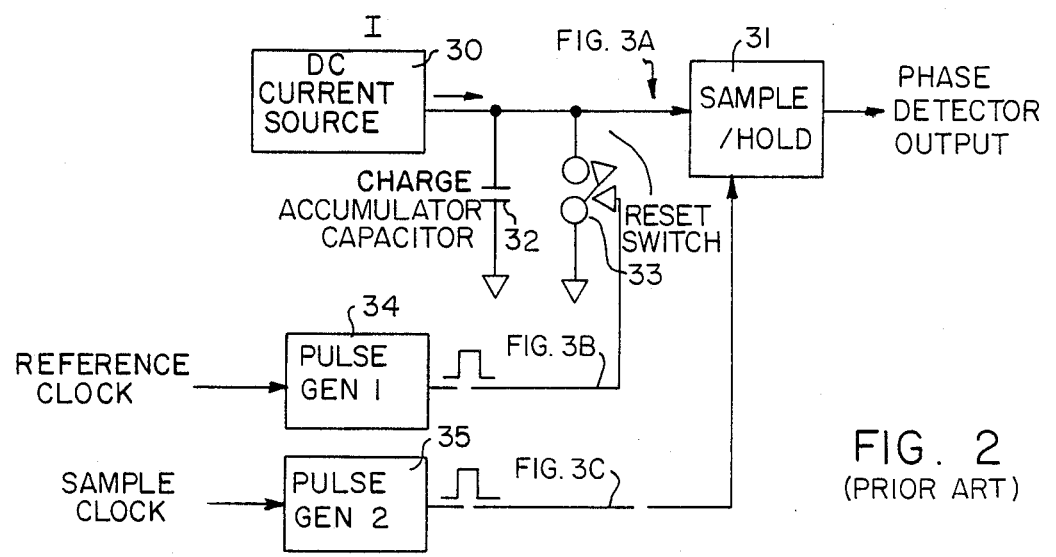
FIG. 2 is a simple block diagram of a prior art sampling phase detector.
Figure 3A:
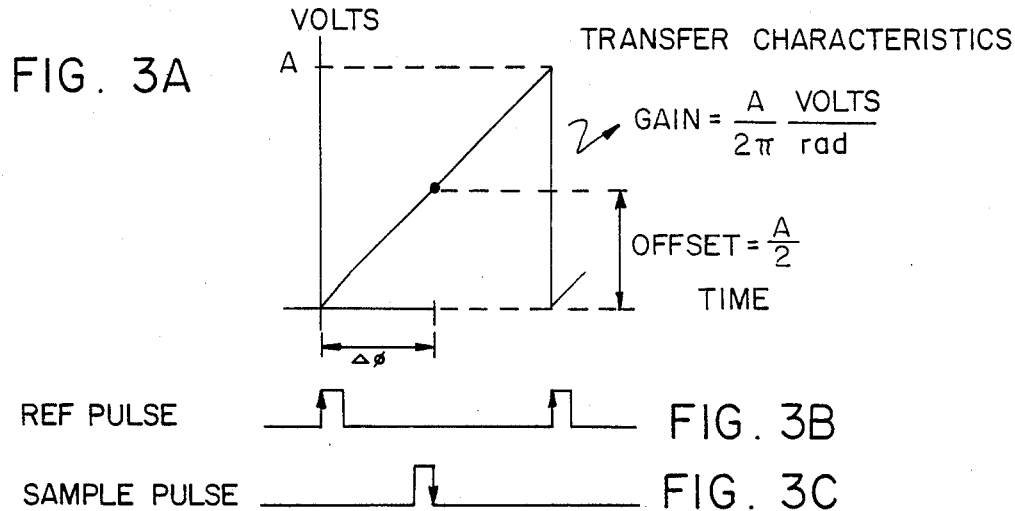

Referring to FIG. 2, there is shown a simplified block diagram of a prior art sampling phase detector such as phase detector 14 shown in FIG. 1. The prior art sample and hold phase detector utilizes a saw tooth phase detector ramp waveform to produce a sampled output proportional to the phase of the reference signal or reference clock as compared to the sample clock. The waveform is shown in FIG. 3A, which is the input to the sample and hold circuit shown in FIG. 2.

As seen in FIG. 2, there is a DC current source 30 having an output connected to one terminal of a capacitor 32 which essentially is shunted by an electronic switch 33. The electronic switch 33 may be an FET or other device. Coupled to the output of the current source is the input of a sample and hold circuit 31. A reference clock which is the reference frequency derived from a stable oscillator is applied to a pulse generator 34 which produces a pulse signal indicative of the reference frequency at an output. This signal is utilized to operate the electronic switch 33 which allows the capacitor 32 to charge and discharge.

As one can ascertain, when switch 33 is closed, the capacitor discharges through switch 33. The sample clock is applied to a second pulse generator 35 which is utilized to activate a sample and hold circuit 31. The sample and hold circuit 31 is a well known component and is available from many different manufacturers. The sample and hold circuit samples the signal present at its input terminal upon receipt of a sample pulse and holds that value at its output terminal until the next sample pulse arrives. In any event, sample and hold circuits as circuit 31 are well known.

The reference pulse which appears at the output of the reference pulse generator 34 as well as the sample pulse which appears at the output of the sample pulse generator 35 are shown in FIGS. 3 as 3B and 3C. The operation of the circuit is as follows.

The DC current source 30 charges the capacitor 32 to provide a saw tooth across the capacitor as shown in FIG. 3A. At each reference pulse which emanates from the pulse generator 34, the reset switch 33 causes the capacitor 32 to discharge. Hence the output is the waveform as shown in FIG. 3A of a saw tooth configuration. The sample and hold circuit 31 which is operated by the sample clock follows the voltage on capacitor 32 and holds that voltage whenever a sample pulse is received.

When the sample pulse occurs again, the sample and hold circuit acquires the new value and holds it until the next sample pulse arrives. Thus, the voltage produced at the output is proportional to the time from each reference pulse to each sample pulse and hence to the phase of the reference signal as compared to the sample signal. Thus, the signal held in the sample and hold circuit 31 which is the output of the circuit is proportional to the phase difference between the sample pulse train which is synchronized to the VCO through the frequency divider (FIG. 1) and the reference pulse train which is synchronized to the reference signal.

As one can see from FIG. 3A, the shape of the prior art phase detector ramp is a saw tooth waveform. The offset of the circuit is A/2 volts with the value being the DC output of the circuit. Since the output of the circuit is updated each reference cycle and does not change at any other time, the circuit is referred to as a sampling phase detector.

Figure 4:
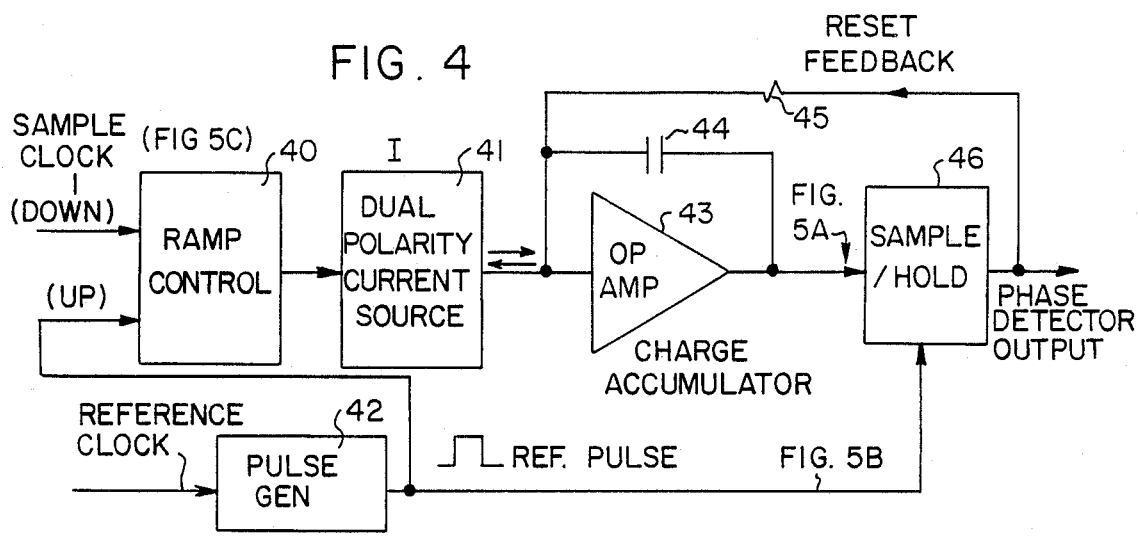
FIG. 4 is a simple block diagram showing an improved phase detector according to this invention.

Referring to FIG. 4, there is shown a simple block diagram describing the improved phase detector according to this invention. In lieu of providing a saw tooth the circuit provides a phase detection ramp which is provided at the input of the sample/hold circuit 46. This ramp consists of negative and positive slopes depending upon the relative phase of the reference pulses as compared to the sample clock pulses. The suitable waveforms as generally employed by the circuit are shown in FIGS. 5, 5A, 5B, and 5C.

Figure 5A:
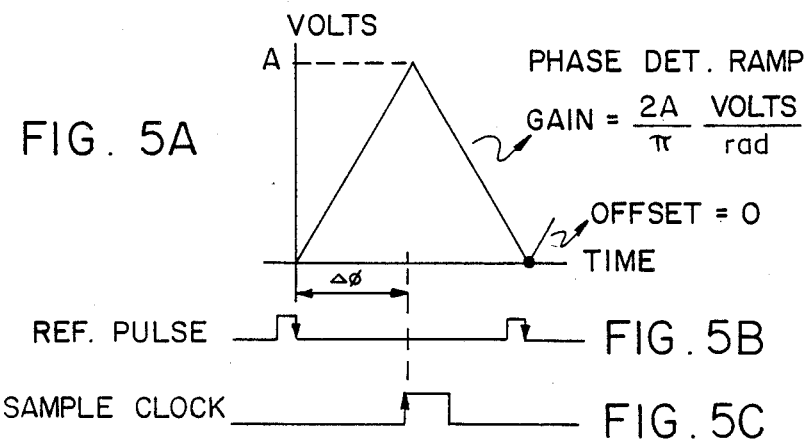

As seen from FIG. 4, the reference clock provides a input to a pulse generator 42 which provides a reference pulse. The reference pulse is utilized in conjunction with the sample clock to control a ramp control circuit 40. The ramp control circuit has an output coupled to a dual polarity current source 41. The current source 41 in conjunction with the ramp control 40 determines the charging of the capacitor 44 which is coupled between the input and output of operational amplifier 43. The output of the operational amplifier 43 provides a ramp voltage of a slope depending on the polarity of the current source as applied to the capacitor. The output of the operational amplifier 43 as shown in FIG. 5A is applied to the input of a sample and hold circuit 46. The output of the sample and hold circuit 46 is the phase detector output and is again coupled back to the input of the operational amplifier via a feedback resistor 45 which as will be explained helps to assure proper operation of the circuit. The circuit operates as follows. Upon receipt of the reference pulse from generator 42, the ramp control 40 causes the current source 41 to provide a first directional or first polarity current signal. This causes the ramp generator as operational amplifier 43 and capacitor 44 to generate a positive slope ramp portion. As soon as a sample clock appears on the down lead of the ramp control, a negative slope is provided due to the change in current source direction. If the sample pulse is 180 degrees out of phase with the reference pulse, the waveform (5A) is symmetrical. If it is not then there is a larger period positive or negative slope portion which causes the sample and hold to provide a positive or negative output control voltage.

Referring to FIG. 6, there is shown a detailed schematic diagram partially in block form of a phase detector according to this invention. As one can see, the reference clock input which is shown in FIG. 7E is applied to the input of a pulse generator 50. The pulse generator for example may be a monostable multivibrator or a series of gates operative to produce at the output of the pulse generator 50 a sample pulse. The sample pulse is shown in FIG. 7B and has the same leading edge as the reference clock and of a shorter duration as shown.

The sample pulse is utilized to provide the sample input to the track and hold amplifier 60 or a sample and hold amplifier. As above indicated, the track and hold amplifier 60 is a conventional component available from many different sources as a commercial integrated circuit. The output from the pulse generator 50 which is a sample pulse is also applied to the input of a pulse generator 51 to produce at the output the pulse designated as a reference pulse and shown in FIG. 7C. As seen, the reference pulse provides a positive edge at the trailing edge of the sample pulse and is for a fixed duration. The reference pulse is applied to the reset input (R) of a D-type flip flop 52. The D flip flop 52 receives a permanent 1 or a high at the D input and receives the sample clock which is shown in FIG. 7D at the clock input (C). The Q output of the D-type flip flop is applied to the base electrode of an NPN transistor 53 having its emitter electrode coupled to the emitter electrode of an NPN transistor 54. Transistors 53 and 54 are arranged in a differential current source configuration where the base electrode of transistor 53 is connected to the Q output of the D-type flip flop 52 while the base electrode of transistor 54 is connected to the $\overline{Q}$ output of the D-type flip flop 52. The common emitter connection of transistor 53 and 54 is directed to a point of reference potential via a current source 55 designated as 21. The collector electrode of transistor 53 is connected to a point of reference potential with the collector electrode of transistor 54 directed to a +V source through a current source 56. The current source 56 is one half the magnitude of current source 53. The output of the bilateral current source is taken from the collector electrode of transistor 54 and is applied to the inverting input of an operational amplifier 57 having its non-inverting input connected to ground. The operational amplifier 57 has a capacitor 58 from input to output which capacitor 58 forms an integrating circuit with the operational amplifier. The output of the operational amplifier is directed to the input of the track and hold amplifier 60 where the output of the track and hold amplifier is the output of the circuit and is fed back to the input of the operational amplifier through a feedback resistor 59 whose function will be subsequently described.

Figure 8:
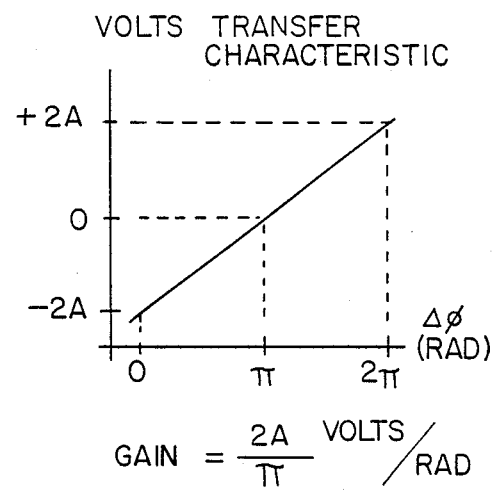
FIG. 8 is a transfer characteristic diagram depicting the operation of the phase detector of FIG. 6.

The output of the phase detector is at the output of the track and hold amplifier whereby the transfer characteristics of the phase detector is shown in FIG. 8. It is immediately noted that the phase detector as shown in FIG. 8 operates between −2A to +2A. This shows an effective swing of 4A and hence the phase detector 20 shown in FIG. 6 has a gain of 4 times the gain of the phase detector shown in FIG. 2. The phase detector shown in FIG. 6 again compares the sample clock input signal to the reference clock input and outputs a voltage proportional to the phase difference between these signals. The output signal is updated once at the end of each reference cycle or reference period and does not change at any other time. This is why the phase detector is designated a sampling phase detector as above indicated.

The operation of the phase detector is as follows. The reference clock signal shown in FIG. 7E is applied to the input of the pulse generator 50. The pulse generator 50 provides at its output a sample pulse (7B) with each positive transition of the reference clock. The sample pulse is fed to the track and hold amplifier 60 where it samples the phase detector ramp waveform at the end of the reference cycle. The pulse is then fed to pulse generator 51 where the trailing edge of the pulse is detected causing a reference pulse (7C) to be generated. The reference pulse at the output of pulse generator 51 is applied to the reset input of the D-type flip flop 52 causing the D-type flip flop to reset. Resetting of the D-type flip flop 52 causes the Q output to go logic zero and the $\overline{Q}$ output to go to a logic 1. This differential signal is coupled to the inputs of the bilateral current source consisting of transistors 53 and 54. The current direction through the integrator capacitor 58 from the current source is such that a phase detector ramp signal commences in the positive slope direction at the output of the op amp integrator 57. The phase detector ramp waveform continues at a positive slope (7A) until a positive transition of the sample clock input signal (7D) is received at the clock input to the D-type flip flop 52.

This signal causes the $\overline{Q}$ output of the D-type flip flop to go to logic 1 and the Q output to go to a logic zero. This causes the current output of the bilateral current source to change direction and the phase detector ramp waveform to start on a downward or negative slope (FIG. 7A). The negative slope of the ramp continues until the next reference clock is received causing the phase detector ramp waveform to be sampled at the end of the reference cycle as described above. The trailing edge of the sample pulse triggers the next reference pulse which starts the next reference cycle.

When the positive transition of the sample clock arrives exactly midway between the adjacent reference pulses, the phase detector output sample will be zero volts for that reference cycle and the ramp waveform will be symmetrical as shown in FIG. 7A. If the sample clock arrives earlier, the phase detector output will be negative and if the sample clock arrives later, the phase detector output will be positive.

FIG. 8 shows the transfer characteristics of the phase detector. If the phase detector output is other than zero volts at the end of any reference cycle, the integrator 57 must be reset so as not to corrupt the phase detector output at the end of the subsequent reference cycle. This can be accomplished by placing an electronic switch across the capacitor 58 and energizing the switch momentarily at the beginning of each reference cycle. This, of course, will remove the previous charge from the capacitor 58. However, an improved reset technique is shown in FIG. 6 which eliminates the need for a reset switch along with the attendant switch induced transients at the phase detector output. The circuit employs a reset current which is applied to the operational amplifier 57 via resistor 59 which is coupled between the output of the track/hold amplifier 60 and the inverting input of the operational amplifier 57. Whenever a non-zero output appears at the track and hold output at the end of the reference cycle, a reset current of magnitude V/R is fed back through the integrator capacitor 58 causing an additional ramp to appear at the integrator output whose value after sampling is adjusted via the resistor 59 to equal −V volts to thus effectively reset the integrator to zero volts. To achieve this, the resistor 59 is set equal to T/C where T is the reference clock period and C is the value of the integrator capacitor.

Thus, as seen in FIG. 6, the reference pulse from generator 51 resets the D-type flip-flop 52 to cause transistor 54 to be biased on causing current to flow in a first polarity direction (positive) to thus cause the integrator to provide a positive slope ramp portion. The positive ramp continues until the flip flop receives a positive transition from the sample clock to set the flip-flop 52 to cause transistor 53 to conduct thus reversing the direction of current flow (negative) to cause the integrator to provide a negative slope ramp. The duration of the negative and positive slope portions is a linear function of the difference in phase between the reference and sample clocks. The track and hold amplifier 60 stores a voltage when sampled which can be positive or negative depending on the phase difference and vary between −2A to −2A (FIG. 8). This voltage has an average or DC level of zero volts providing the phase detector with a zero offset characteristic.

What is claimed:

1. A phase detector apparatus for providing an output error signal indicative of the phase difference between a stable reference frequency and a variable sample frequency with said error signal used to control the frequency of a voltage controlled oscillator (VCO) to enable the oscillator to lock to the reference frequency, comprising:

a ramp generator means operative to provide at an output a ramp voltage waveform having a positive slope portion and a negative slope portion for a phase difference between said sample and reference frequency, where the duration of said positive or negative slope portion differs according to said phase difference, a sample and hold circuit means having an input coupled to said output of said generator means for storing a voltage indicative of the amplitude and slope of said ramp waveform during a specified period and for providing an output voltage indicative of said stored voltage to be employed as said error signal.

2. The phase detector apparatus according to claim 1, wherein said ramp generator means includes,
   first pulse generator means responsive to said reference frequency for providing at an output a pulse train of a repetition rate determined by said reference frequency,
   a bilateral current source means responsive to said pulse train and to said sample frequency to provide at an output a first current signal in a first direction and a second current signal in a second direction each of a duration according to the difference in phase between said sample and reference signals, and
   an integrator means having an input coupled to said output of said current source to provide a ramp waveform of a first direction slope for said first current signal and a second direction slope for said second current signal.

3. The phase detector apparatus according to claim 2, wherein said integrator means includes an operational amplifier having a capacitor connected between the input and output and having said input coupled to said output of said current source and said output coupled to said input of said sample and hold means.

4. The phase detector apparatus according to claim 3 wherein said ramp generator means includes a flip-flop having one input responsive to said reference frequency and another input responsive to said sample frequency to provide first and second outputs indicative of the phase difference between said reference and sample frequencies and means coupling said first and second outputs of said flip-flop to said bilateral current source to provide said first current signal for a high condition on said first output and said second current signal for a high condition on said second output.

5. The phase detector apparatus according to claim 4, wherein said (PLL) flip-flop is a D-type flip-flop.

6. The phase detector apparatus according to claim 4, wherein said bilateral current source includes first and second transistors with the base electrode of said first transistor connected to one output of said flip-flop and with the base electrode of said second transistor connected to the other output of said flip-flop with the emitter electrodes connected together and directed to a first reference potential through a first current source, with the collector electrode of said first transistor coupled to a second reference potential through a second current source and with the collector of said second transistor coupled to a third reference potential.

7. The phase detector apparatus according to claim 6, wherein said first current source is twice the magnitude of said second current source.

8. The phase detector apparatus according to claim 7, wherein said first and second transistors are NPN devices.

9. The phase detector apparatus according to claim 8, further including a resistor coupled between the output of said sample and hold circuit means to the input of said operational amplifier.

10. The phase detector apparatus according to claim 1, wherein said phase detector apparatus is for use in a phase locked loop (PLL) synthesizer.

11. A phase detector apparatus particularly adapted for use in a phase locked loop (PLL) to compare a reference signal of a given frequency with a sample signal from a VCO to provide an output error signal for controlling the frequency of said VCO to be synchronized to said reference frequency, comprising:
   pulse generator means responsive to said reference signal to provide at first and second outputs first and second pulse trains,
   a bilateral current source means responsive at one input to said sample signal and at another input to said second pulse train signal to provide at an output a first directional current for said second pulse train and to change said current direction to an opposite directional current during the presence of said sample signal,
   ramp generator means responsive to said first and second directional currents to provide a positive slope signal for said first current direction and a negative slope signal for said second current direction,
   a track and hold amplifier means responsive to said first pulse train and coupled to said ramp generator means to store and hold a portion of said ramp waveform during a pulse from said second pulse train, whereby said track and hold amplifier means provides positive signals for given phase differences between said reference and sample signals and negative signals for other phase differences wherein said output of said track and hold amplifier provides said error signal.

12. The phase detector apparatus according to claim 11, wherein said ramp generator means includes an operational amplifier having a capacitor coupled between the input and output terminals with said input terminal coupled to said bilateral current source.

13. The phase detector apparatus according to claim 12, further including a resistor coupled between the input terminal of said operational amplifier and the output of said track and hold amplifier.

14. The phase detector apparatus according to claim 11, wherein said bilateral current source means includes a flip-flop having one input responsive to said second pulse train to provide a first output level for pulses within said second pulse train and a second output level during the presence of said sample frequency with said output levels sufficient to control a current source to operate between said first and second current directions.

15. The phase detector apparatus according to claim 14, wherein said bilateral current source means includes first and second transistors having the emitter electrodes returned to a first reference potential through a first current source, with the base electrode of a first transistor coupled to one output of said flip-flop with the base electrode of said second transistor coupled to the other output of said flip-flop, with the collector electrode of said first transistor coupled to a second reference potential and with the collector electrode of said second transistor coupled to a third reference potential via a second current source.

16. The phase detector apparatus according to claim 15, wherein said first current source is twice the magnitude of said second current source.

17. The phase detector apparatus according to claim 16, wherein said transistors are NPN devices.

18. The phase detector apparatus according to claim 16, wherein said flip-flop is a D-type flip-flop.

19. The phase detector apparatus according to claim 15 for use in a wideband synthesizer.

20. The phase detector apparatus according to claim 15 having an effective gain equal to $2A/\omega$ where A is the amplitude of the phase detector ramp waveform.

21. The phase detector apparatus according to claim 15 having a zero volt DC offset at the output.

* * * * *